United States Patent [19]

Core

[11] Patent Number: 5,480,831
[45] Date of Patent: Jan. 2, 1996

[54] METHOD OF FORMING A SELF-ALIGNED CAPACITOR

[75] Inventor: Craig E. Core, North Andover, Mass.

[73] Assignee: Analog Devices, Inc., Wilmington, Mass.

[21] Appl. No.: 404,314

[22] Filed: Mar. 15, 1995

Related U.S. Application Data

[62] Division of Ser. No. 316,921, Oct. 3, 1994.

[51] Int. Cl.$^6$ ............................. H01L 21/70; H01L 27/00
[52] U.S. Cl. ................................ 437/60; 437/919
[58] Field of Search ........................ 437/47, 52, 60, 437/919; 257/300, 303, 306

[56] References Cited

U.S. PATENT DOCUMENTS 5,037,772  8/1991  McDonald ................. 437/52
5,173,437  12/1992  Chi ............................ 437/60
5,397,729  3/1995  Kayanuma et al. ........ 437/52

Primary Examiner—Mary Wilczewski
Assistant Examiner—H. Jey Tsai
Attorney, Agent, or Firm—Iandiorio & Teska

[57] ABSTRACT

A self-aligned capacitor structure and method of making it includes an insulating support substrate with the capacitor disposed on the insulating substrate with a first conducting extending across the capacitor in the first dimension. The capacitor includes a first electrode interconnected with the first conductor, a second electrode supported by the substrate and interconnected with the second conductor, and a dielectric medium between the first and second electrodes. The first and second electrodes being coterminous in both directions in the first dimension for eliminating parasitic capacitance between the first conductor and the second electrode.

2 Claims, 4 Drawing Sheets

METHOD OF FORMING A SELF-ALIGNED CAPACITOR

This is a division of application Ser. No. 08/316,921, filed Oct. 3, 1994.

FIELD OF INVENTION

This invention relates to a self-aligned capacitor structure and method of making it, and more particularly to such a capacitor structure and method which eliminates a major source of parasitic capacitance.

BACKGROUND OF INVENTION

In certain applications, such as analog to digital converters (ADC) it is extremely desirable to have an array of capacitors whose capacitances remain in a predetermined ratio to each other. However, the 16 bit or better accuracy now achievable with such ADC's require even more stable capacitance values over wide ranges of temperature. In typical integrated circuit fabrication the desired accuracy and stability is difficult to obtain because of parasitic capacitance which is inherently unstable and unpredictable and generally uncontrollable. A major source of parasitic capacitance in such capacitors occurs between the lower capacitor electrode on the substrate and the metal conductor which connects to the upper capacitor electrode. The dielectric medium of the parasitic capacitance is typically formed at least in part by the interlevel insulator which is a poor quality dielectric because its capacitance changes unpredictably upon application of an electric field. One commonly used such interlevel insulator which is desirable for a number of other reasons is borophosphate silica glass.

SUMMARY OF INVENTION

It is therefore an object of this invention to provide an improved self-aligned capacitor structure and method of fabricating it which eliminates a serious source of parasitic capacitance.

It is a further object of this invention to provide such a capacitor structure and method which is simple and inexpensive to fabricate.

It is a further object of this invention to provide such a capacitor structure and method which is particularly suitable for standard integrated circuit fabrication.

It is a further object of this invention to provide such a capacitor structure and method which results in a smaller capacitor with higher packing density while eliminating parasitic capacitance.

It is a further object of this invention to provide such a capacitor structure and method which requires no additional steps in the fabrication process.

The invention results from the realization that a highly accurate and stable capacitor and array of capacitors which avoids a serious source of parasitic capacitance can be fabricated by making the capacitor electrodes coterminous in both directions in the dimension in which the conductor that engages one of the capacitor electrodes crosses the capacitor so that the other capacitor electrode is not exposed and cannot act as a part of a parasitic capacitance in conjunction with the conductor and the interlevel insulator.

This invention features a self-aligned capacitor structure including an insulating support substrate and a capacitor disposed on the insulating substrate with a first conductor extending across the capacitor in the first dimension. The capacitor includes a first electrode interconnected with the first conductor, a second electrode supported by the substrate and interconnected with the second conductor, and a dielectric medium between the first and second electrodes. The first and second electrodes are coterminous in both directions in the first dimension for eliminating parasitic capacitance between the first conductor and the second electrode.

In a preferred embodiment the dielectric medium may be coterminous with the electrodes in both directions in the first dimension. The capacitor may include an interlevel insulator between the first conductor and the capacitor which contributes to the parasitic capacitance. The second electrode may extend beyond the first electrode in both directions of a second dimension transverse to the first dimension for accommodating shifts in the location of the second electrode relative to the first electrode in the second dimension while maintaining a predetermined area of the first electrode. The substrate may include a base of conducting material and a cover layer of insulating material for carrying the capacitor. The base may be silicon, the cover layer may be silicon dioxide, the first and second electrodes may be polysilicon, the dielectric medium may be silicon dioxide, and the first conductor may be an aluminum-copper alloy. The interlevel insulator may be borophosphate silica glass.

The invention also features a self-aligned capacitor structure including an insulating support substrate and a capacitor disposed on the insulating substrate with a first conductor extending across the capacitor in the first dimension. An interlevel insulator is disposed between the first conductor and the capacitor. The capacitor includes a first electrode interconnected with the first conductor, a second electrode supported by the substrate and interconnected with the second conductor, and a dielectric medium between the first and second electrodes. The first and second electrodes are coterminous in both directions in the first dimension for eliminating parasitic capacitance constituted by the first conductor and the second electrode with the interlevel insulator acting as a dielectric medium.

The invention also features a method of fabricating a self-aligned capacitor structure including constructing a stack having a second capacitor electrode on a substrate, a dielectric medium on the second electrode, and the first electrode on the dielectric medium. A first resist is applied to the first electrode. The electrodes and dielectric medium are removed from areas other than under the resist so that the second electrode is coterminous with the first electrode in both directions in the first dimension. The first resist is removed and the second resist is supplied to the first electrode and overlapping the stack in both directions in the first dimension, but short of the edges of the stack in both directions in the second dimension transverse to the first dimension. This ensures that the stack has a fixed area notwithstanding the shift of the application of the second resist and for exposing the dielectric medium and the first electrode in the second dimension, respectively.

In a preferred embodiment the method may further include applying an interlevel insulator to the substrate and stack, applying a conductor connected to the first electrode, and extending across the stack in the first direction and removing a portion of the dielectric medium for defining access to the second electrode.

DISCLOSURE OF PREFERRED EMBODIMENT

Other objects, features and advantages will occur to those skilled in the art from the following description of a preferred embodiment and the accompanying drawings, in which.

Figure 1:
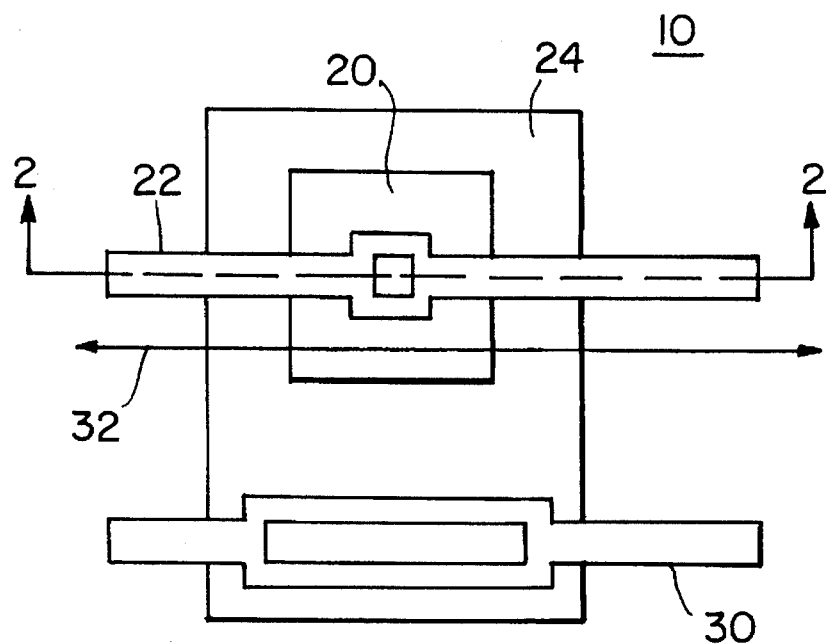
FIG. 1 is a diagrammatic top plan view of a conventional integrated circuit capacitor structure.
Figure 2:
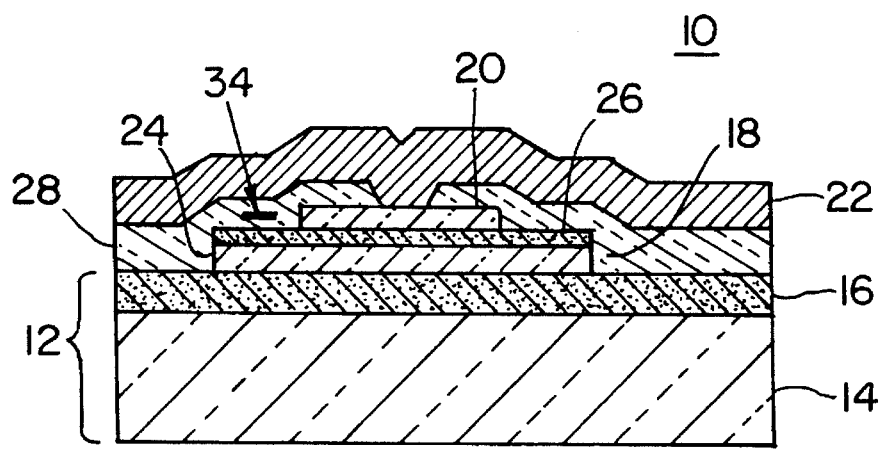
FIG. 2 is a diagrammatic cross-sectional view taken along line 2—2 of FIG. 1.

There is shown in FIGS. 1 and 2 prior art capacitor structure 10 which includes a substrate 12 typically comprising a base layer 14 of conductive material such as silicon and an upper layer 16 of an oxide insulator such as silicon dioxide. Carried on substrate 12 is capacitor 18 which includes a first electrode 20 interconnected with metal conductor 22 and a second electrode 24 which is mounted on substrate 12. The dielectric medium 26 is disposed between electrodes 20 and 24. The electrodes may be made out of a conductor such as polysilicon and the dielectric medium may be silicon dioxide or other suitable insulator or dielectric material such as silicon nitride or tantalum pentoxide. An interlevel insulator 28 such as borophosphate silica glass is disposed between conductor 22 and capacitor 18 on substrate 12. Electrode 20 is interconnected electrically to external components through conductor 22. Electrode 24 mounted on the surface of substrate 12 is interconnected with external components through conductor 30. Capacitor 18 suffers from parasitic capacitance because it has been realized electrode 24 extends beyond electrode 20 in both directions in the dimension 32 in which conductor 22 extends. Thus conductor 22 acts as one electrode of the parasitic capacitor 34 and electrode 24 of capacitor 18 acts as the other electrode of parasitic capacitor 34. The problem is compounded because the interlevel insulator 28 acts as the dielectric medium and this material is inherently unpredictable and uncontrollable, and also unstable. That is, its dielectric qualities in a capacitor are not predictable when an electric field is placed across it. Therefore the total capacitance which will be reflected is a combination of the precise and accurate capacitor 18 plus the unpredictable and unstable parasitic capacitance 34. In applications such as ADC capacitor arrays where accuracy and the ratio of a multiplicity of capacitors in a capacitor array is critical, such parasitic capacitors can degrade the device to unacceptable levels.

Figure 3:
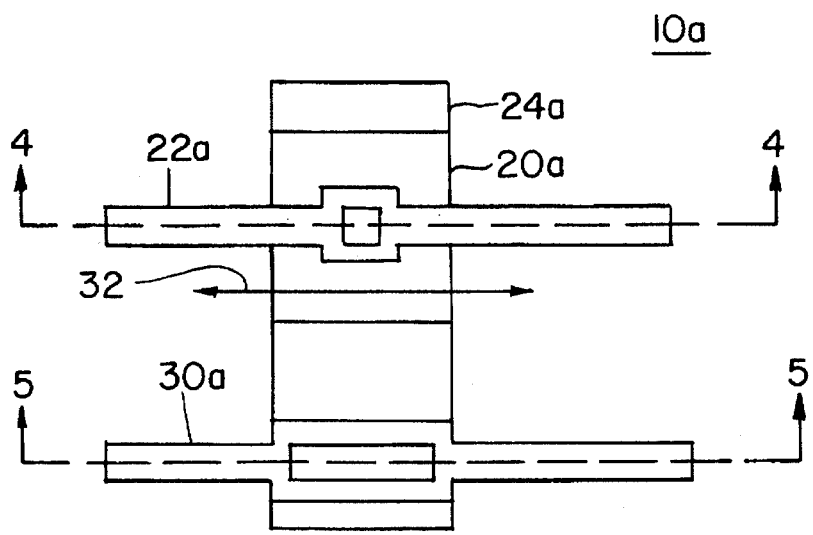
FIG. 3 is a diagrammatic top plan view similar to FIG. 1 of a self-aligning capacitor structure according to this invention.
Figure 4:
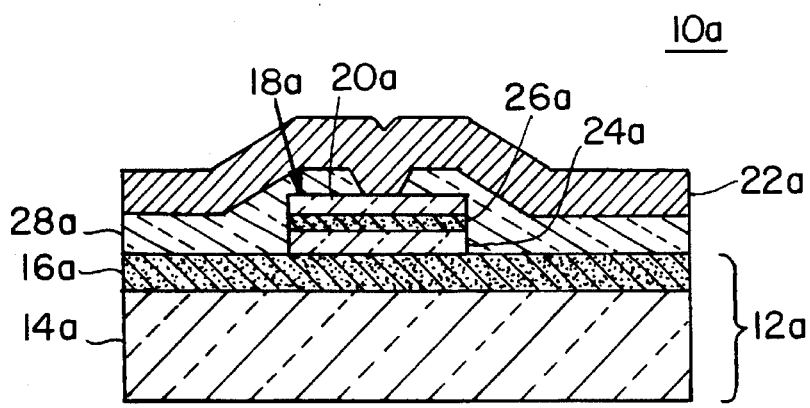
FIG. 4 is a diagrammatic cross-sectional view taken along line 4—4 of FIG. 3.

In accordance with this invention, as shown in FIGS. 3 and 4, where like elements have been given like numbers accompanied by a lower case letter a, the parasitic capacitor 34 has been totally eliminated by eliminating the extension of electrode 24a so that electrode 20a and electrode 24a are coterminous in both directions in the dimension 32 along which conductor 22a extends. Since electrode 24a is totally shadowed or covered by electrode 20a, there is no lower electrode beneath conductor 22a which can sandwich interlevel insulator 28a as the dielectric medium between them.

Figure 5:
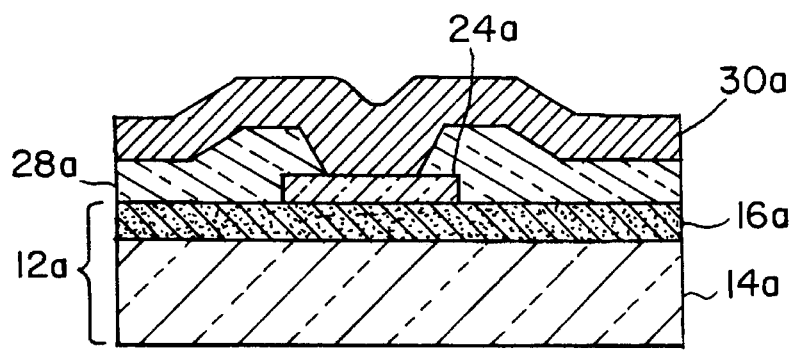
FIG. 5 is a diagrammatic cross-sectional view taken along line 5—5 of FIG. 3.
Figure 6:
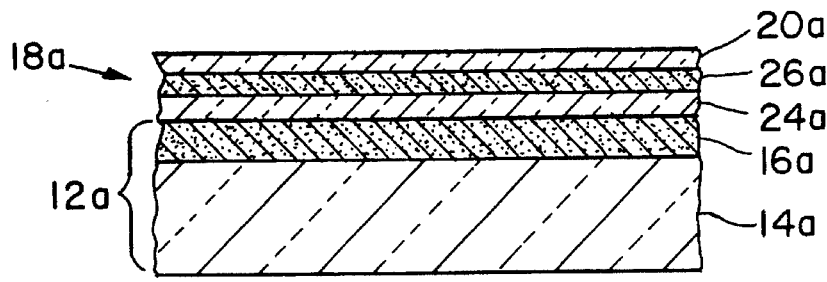
FIG. 6 is a diagrammatic cross-sectional view in section showing the substrate capacitor layers forming a stack in accordance with the method of this invention.
Figure 7:
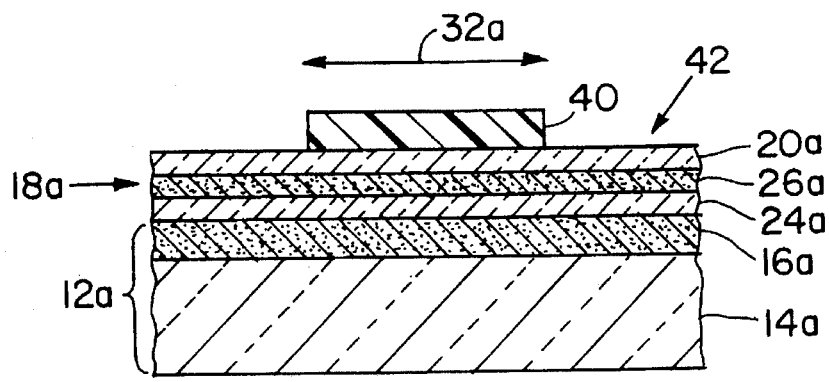
FIG. 7 is a diagrammatic cross-sectional view similar to FIG. 6 with the resist in place on the stack.

The connection of the electrode 24a to conductor 30a in FIGS. 3 and 4 as well as the connection of electrode 24 to conductor 30 in FIGS. 1 and 2, is shown more clearly in FIG. 5, where it can be seen that a portion of conductor 30a drops down or extends through interlevel insulator level 28a to contact the top of electrode 24a to make electrical connection.

Figure 8:
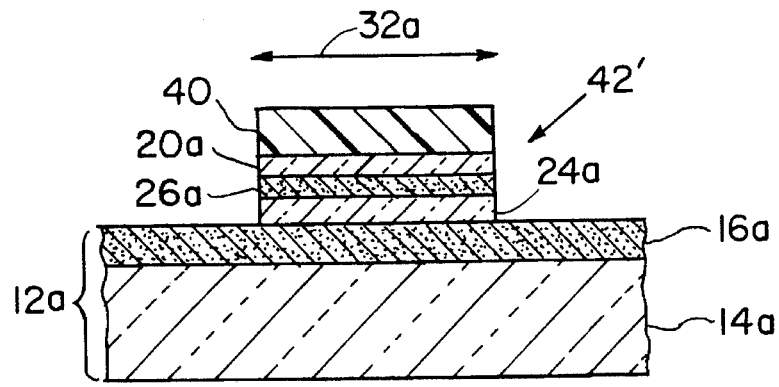
FIG. 8 is a diagrammatic cross-sectional view similar to FIG. 7 after the stack has been etched outside of the resist.
Figure 9:
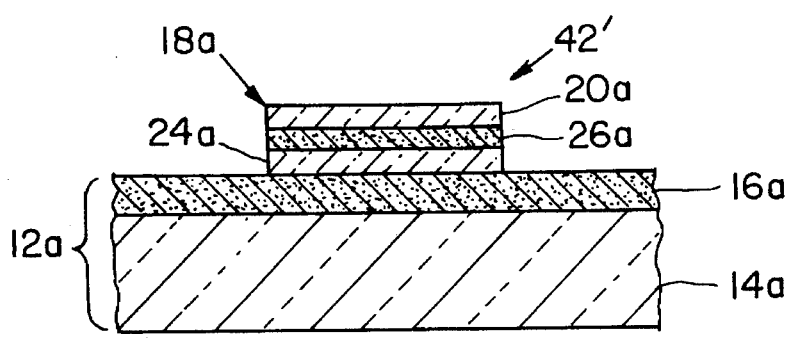
FIG. 9 is a diagrammatic cross-sectional view similar to FIG. 8 with the resist removed.
Figure 10:
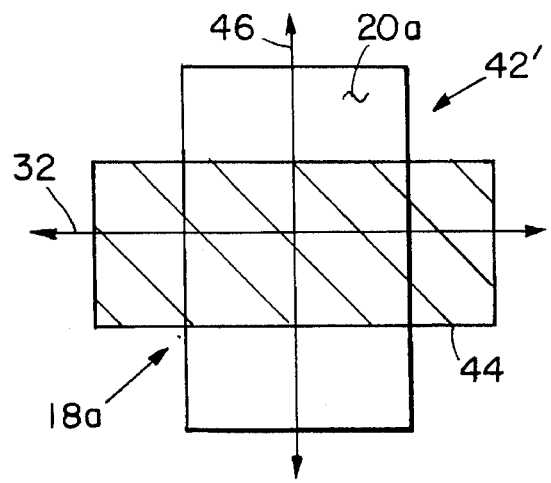
FIG. 10 is a diagrammatic top view of the stack of FIG. 9 with a second resist in place over the top and overlapping on the sides.
Figure 11:
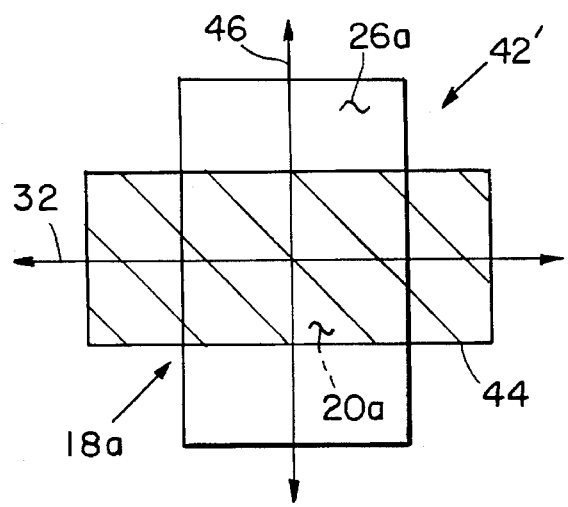
FIG. 11 is a diagrammatic view similar to FIG. 10 after the etch has removed the top electrode, leaving only the bottom electrode and dielectric medium.
Figure 12:
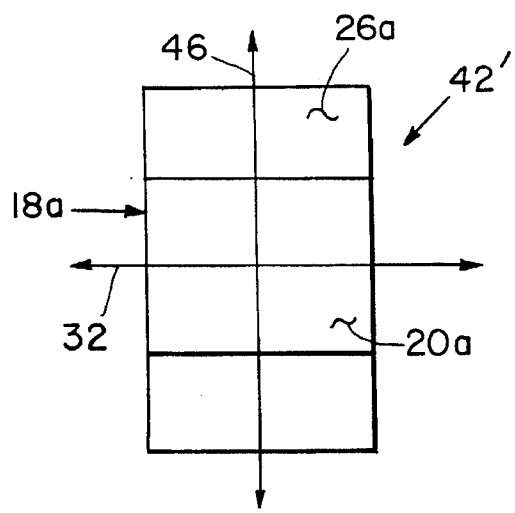
FIG. 12 is a view similar to FIG. 11 with the resist removed.

In accordance with the method of this invention, electrodes 24a and 20a made of, e.g., polysilicon are deposited on substrate 12a with dielectric medium 26a, silicon oxide for example, between them. Substrate 12a again includes a conducting substrate 14a such as silicon oxide and an insulating oxide 16a such as silicon dioxide. A resist 40 such as Novolac resins is deposited on top of the stack 42 and has a width which is the final desired width in the dimension 32 corresponding to the extension of the conductor. The etching occurs so that in FIG. 8 the stack 42' appears foreshortened to the desired width in the direction of dimension 32a. Resist 40 is then removed, FIG. 9. Stack 42', FIG. 10, is now covered with a second resist 44, FIG. 10, which extends only part way toward the edges of stack 42' in the second dimension 46 transverse to the first dimension 32. This is done so that even if the resist is slightly shifted in either direction of dimension 32 the stack will not be foreshortened in that dimension causing a reduction in area which will seriously affect the precision and the accuracy of the finished capacitor and interfere with the precision ratios that may be demanded in an array of such capacitors. The electrode does not actually shift after fabrication. The position of the electrode is defined by the resist (which is subsequently removed). So placement of the resist will determine the final location of the electrode. Once the resist is removed it can appear that the electrode is located in different positions from production batch to production batch. Etching takes place and in FIG. 11 the top layer is no longer electrode 20a but rather dielectric medium 26a. With photoresist 44 removed, FIG. 12, stack 42' has its top electrode 20a extending coterminously in both directions of dimension 32 with electrode 24a, not shown. Electrode 24a covered by dielectric medium 26a do extend beyond upper electrode 20a in the transverse dimension 46.

In FIGS. 6–12, the substrate and additional layers are exposed to various substances to remove the individual layers. The material that is selected to remove each layer is chosen since its chemical or mechanical properties will cause one layer to be etched but the others to remain intact. An example of this is shown in going from FIG. 7 to FIG. 8. The processing steps that occur to change the structure are a series of etches. The first material used to etch is an $SF_6/O_2$ plasma that will etch polysilicon (Poly 2) and not silicon dioxide. The second material used is hydrofluoric acid which will etch the exposed silicon dioxide stopping on the polysilicon (Poly 1). The third etch material is again $SF/O_2$ plasma which etches polysilicon (Poly 1) stopping on the Thox (also an oxide).

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A method of fabricating a self-aligned capacitor structure comprising:

constructing a stack including a second capacitor electrode on a substrate, a dielectric medium on said second electrode and a first electrode on said dielectric medium;

applying a first resist to said first electrode;

removing said first and second electrodes and dielectric medium elsewhere than under said first resist so that said second electrode is coterminous with said first electrode in both directions in a first dimension;

removing said first resist;

applying a second resist to said first electrode and overlapping said stack in both directions in said first dimension and short of edges of said stack in both directions in a second dimension transverse to said first dimension for insuring that said stack has a fixed area notwithstanding a shift of the application of said second resist and for exposing said dielectric medium and first electrode in said second dimension, respectively.

2. The method of claim 1 further including applying an interlevel insulator to said substrate and stack, applying a conductor connected to said first electrode having removed a portion of said dielectric medium for defining access to said first electrode and extending across said stack in said first dimension, and removing a portion of said dielectric medium for defining access to said second electrode.

* * * * *